(12) United States Patent
Budelman

(10) Patent No.: US 6,349,760 B1
(45) Date of Patent: Feb. 26, 2002

(54) METHOD AND APPARATUS FOR IMPROVING THE THERMAL PERFORMANCE OF HEAT SINKS

(75) Inventor: Gerald A. Budelman, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/425,627

(22) Filed: Oct. 22, 1999

(51) Int. Cl.[7] ................................................. H05K 7/20
(52) U.S. Cl. ................................ 165/80.4; 165/104.33; 361/700
(58) Field of Search ......................... 165/80.4, 104.33, 165/908, 80.3; 361/700

(56) References Cited

U.S. PATENT DOCUMENTS

| | | | |
|---|---|---|---|
| 3,313,339 A | 4/1967 | Coe ........................... 165/80.3 |
| 3,817,321 A * | 6/1974 | von Cube et al. ....... 165/104.33 |
| 4,790,374 A | 12/1988 | Jacoby ........................ 165/185 |
| 4,804,503 A * | 2/1989 | Komiya ........................ 261/153 |
| 4,884,331 A | 12/1989 | Hinshaw ..................... 165/80.3 |
| 4,899,210 A | 2/1990 | Lorenzetti et al. ........... 165/804 |
| 5,016,090 A * | 5/1991 | Gaylon et al. ................. 357/82 |
| 5,183,104 A * | 2/1993 | Novotny ................. 165/104.33 |
| 5,316,075 A * | 5/1994 | Quon et al. ................. 165/80.4 |
| 5,394,936 A | 3/1995 | Budelman ............... 165/104.33 |
| 5,432,526 A * | 7/1995 | Hyatt ............................. 345/87 |
| 5,469,330 A | 11/1995 | Karabatsos et al. ......... 361/704 |
| 5,535,094 A | 7/1996 | Nelson et al. ............... 361/697 |
| 5,584,339 A | 12/1996 | Hong ........................ 165/80.3 |
| 5,597,034 A | 1/1997 | Barker, III et al. ........ 165/80.3 |
| 5,623,828 A | 4/1997 | Harrington ..................... 62/3.2 |
| 5,661,638 A | 8/1997 | Mira ........................... 361/697 |
| 5,689,404 A | 11/1997 | Katsuie ....................... 361/697 |
| 5,719,444 A * | 2/1998 | Tilton et al. ................. 257/714 |
| 5,760,333 A | 6/1998 | Kitahara et al. ............. 174/16.3 |
| 5,781,411 A | 7/1998 | Feenstra ..................... 361/804 |
| 5,818,694 A | 10/1998 | Daikoku et al. ............ 361/703 |
| 5,832,986 A | 11/1998 | Kenny et al. ............... 165/80.3 |
| 5,860,472 A | 1/1999 | Batchelder ................... 165/185 |
| 5,894,882 A | 4/1999 | Kikuchi et al. ............. 165/80.3 |
| 5,943,209 A | 8/1999 | Liu .............................. 361/695 |
| 5,991,152 A | 11/1999 | Chiou ......................... 361/704 |
| 5,992,511 A | 11/1999 | Kodaira et al. ............. 165/80.3 |
| 6,015,008 A | 1/2000 | Kogure et al. ............... 165/185 |
| 6,050,101 A * | 5/2000 | Liu .............................. 62/280 |
| 6,067,227 A | 5/2000 | Katsui et al. ............... 165/80.3 |
| 6,069,794 A | 5/2000 | Chuang ....................... 361/697 |
| 6,205,803 B1 * | 3/2001 | Scaringe .................... 62/259.2 |

* cited by examiner

*Primary Examiner*—Allen Flanigan
(74) *Attorney, Agent, or Firm*—Blakely, Sokoloff, Taylor & Zafman LLP

(57) ABSTRACT

A heat removal system for removing heat from an electric device. The heat removal system includes a heat sink coupled to an electric device. The heat sink absorbs heat generated by the electric device, and may be in direct contact or remotely thermally coupled to the electric device. A gas source is provided to flow or direct a gas stream such as air onto the heat sink. A liquid source is provided from which liquid droplets such as water are dispensed onto the heat sink. The liquid droplets absorb heat from the heat sink and evaporate into the gas stream moving across the heat sink from the gas source. The thermal efficiency of the heat sink is improved by exploiting the energy absorption characteristics of the vapor phase of the liquid.

17 Claims, 6 Drawing Sheets

METHOD AND APPARATUS FOR IMPROVING THE THERMAL PERFORMANCE OF HEAT SINKS

FIELD OF THE INVENTION

The present invention relates generally to the field of thermal dissipation devices and, more particularly, to a method and an apparatus for improving the thermal performance of heat sinks.

BACKGROUND OF THE INVENTION

Thermal dissipation devices are present in a wide variety of applications. Such devices generally employ conduction, convection, or a combination of conduction and convection to dissipate heat generated by a heat source. Conduction is the transfer of heat by the movement of heat energy from a high temperature region to a low temperature region in a body. Convection is the transfer of heat from the surface of a body by the circulation or movement of a liquid or gas over the surface.

A heat sink is one example of a thermal dissipation device. A heat sink is typically a mass of material (usually metal) that is thermally coupled to a heat source and draws heat energy away from the heat source by conduction of the energy from a high-temperature region to a low-temperature region of the metal. The heat energy can then be dissipated from a surface of the heat sink to the atmosphere by convection. A well known technique of improving the efficiency of a conductive heat sink is to provide a greater surface area on the heat sink so that more heat can dissipate from the heat sink into the atmosphere by natural (or free) convection. Increased surface area is typically provided by fins that are formed on a base portion of the heat sink. The thermal efficiency of a heat sink can be further increased by employing forced convection wherein a flow or stream of air is forced over and around the surface of the heat sink.

One example of an application in which thermal dissipation devices are used is an electric device such as a microprocessor. Heat can be dissipated from an electric device through the outer surfaces of the device into the ambient atmosphere or into a stream of air driven by a fan, for example. In some cases, a heat sink is provided that is coupled to the electric device to provide more efficient dissipation of heat from the device. Heat generated by the device is transferred through an adhesive bonding agent, for example, into the heat sink. The heat then travels through the heat sink by conduction and is finally dissipated into the atmosphere by natural or forced convection. A fan is commonly employed to provide additional air flow across the heat sink to dissipate a greater amount of heat energy.

As the number of components in electric devices increases, or as the power requirements or operating speeds of the electric devices increases, the amount of heat generated can increase to a point where conventional heat sink and air convection solutions are inadequate For example, the air flow required to dissipate the greater level of heat can become excessive, or the physical size of the heat sink required to dissipate the heat can become prohibitive for the particular application.

High efficiency heat sinks such as those that can dissipate high power (more than 50 watts, for example) may require a substantial flow of air through and around the heat sink. A substantial air flow may be required because the specific heat of air is fairly low, i.e. a given amount of heat transferred to a particular volume of air results in a relatively high temperature rise of the air, thus limiting the efficiency of an air cooled heat sink. Also, a fairly high impinging velocity to ensure turbulent air flow in the vicinity of a heat radiating surface may be required to increase efficiency.

Using a fan to increase air flow around a heat sink allows a particular heat sink to be smaller in size in order to dissipate a similar amount of heat as a larger heat sink without a fan, for example. Since the thermal efficiency of a conventional heat sink is increased by increasing the air flow over the heat sink, the use of additional fans or fans capable of providing air flow with a greater velocity are ways of providing the additional air flow. A fan, however, consumes additional electrical power, contributes additional audible noise to the system, and increases system failures because of moving parts in the fan.

The limitations of an air-cooled heat sink can be reduced by using a liquid to absorb heat. It is well known that the vapor phase transition of a liquid can be exploited to provide a heat sink of a high thermal efficiency. Most heat sinks that use a liquid, however, involve a closed system with valves or pumps and seals. For example, a heat pipe uses a liquid-vapor transition to transfer heat from one end of a structure to the other. The liquid-vapor transition is not actually used to dissipate the heat to the atmosphere in such closed systems. Typically, the heat is dissipated to the atmosphere by convection, in a similar fashion as a simple air cooled, finned heat sink. Most current vapor phase heat sinks only transport heat from one place to another and leave the task of actually dissipating the heat into the atmosphere as an additional step. Air media heat sinks can be made to be very efficient, but require larger surface area, higher air flow, or exotic materials.

BRIEF DESCRIPTION OF THE DRAWINGS

The present invention is illustrated by way of example, and not limitation, in the figures of the accompanying drawings in which.

DETAILED DESCRIPTION

A method and an apparatus for improving the thermal efficiency of heat sinks is described. In the following description, for purposes of explanation, numerous details are set forth in order to provide a thorough description of various embodiments of the invention.

An embodiment of the invention provides a method and an apparatus for improving the thermal efficiency of heat sinks. Various embodiments can be used to improve the efficiency of a heat sink that is coupled to a heat source. Examples of heat sources are electric devices such as computer equipment, integrated circuits, or other electric devices that generate heat during operation. The method includes dispensing droplets of a liquid onto a heat sink that is thermally coupled to a heat source such as an electric device. The droplets on the heat sink absorb heat from the heat sink and transform into vapor. The method further includes directing a stream of air to impinge on the heat sink and to move past the heat sink. The stream of air carries the vapor from the evaporated droplet away from the heat sink as it moves past the heat sink.

Figure 1:
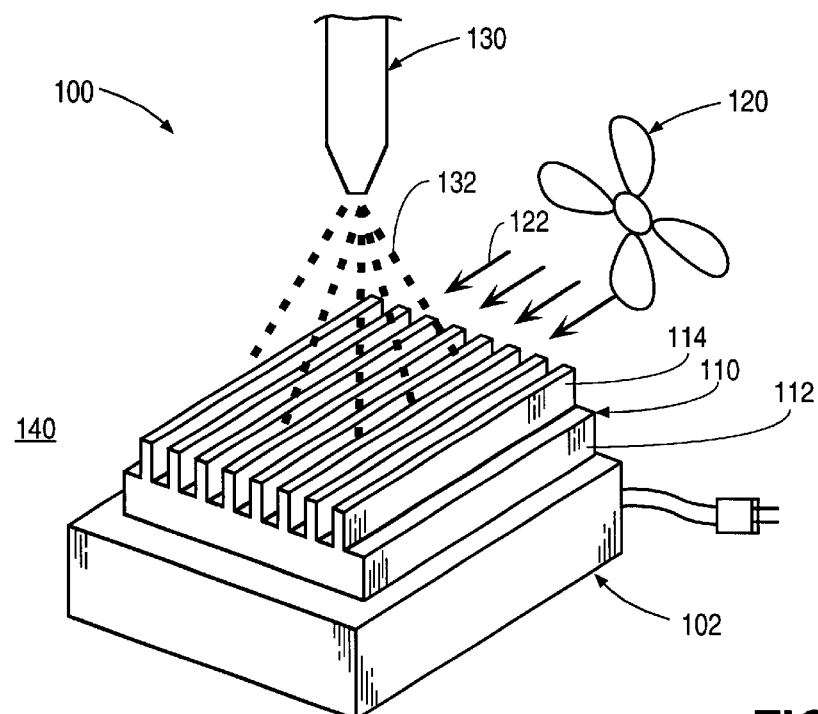
FIG. 1 is a perspective view of a heat removal system in accordance with an embodiment of the invention.

An example of an apparatus in accordance with one embodiment of the invention is shown in FIG. 1. FIG. 1 shows a heat removal system 100 to remove heat from an electric device 102. The system 100 includes a heat sink 110 coupled to the electric device 102. Heat sink 110 is thermally coupled to electric device 102 such that heat sink 110 can absorb the heat generated by electric device 102 at an acceptable temperature.

The heat sink 110 can include a plurality of fins 114 extending from a base 112, as shown in FIG. 1. The heat removal system 100 further includes a gas source 120 and a liquid source 130. One example of a gas source 120 is a conventional bladed fan that forces a gas stream 122 across fins 114 of the heat sink 110. The liquid source 130 directs droplets 132 onto the heatsink 110.

Figure 2:
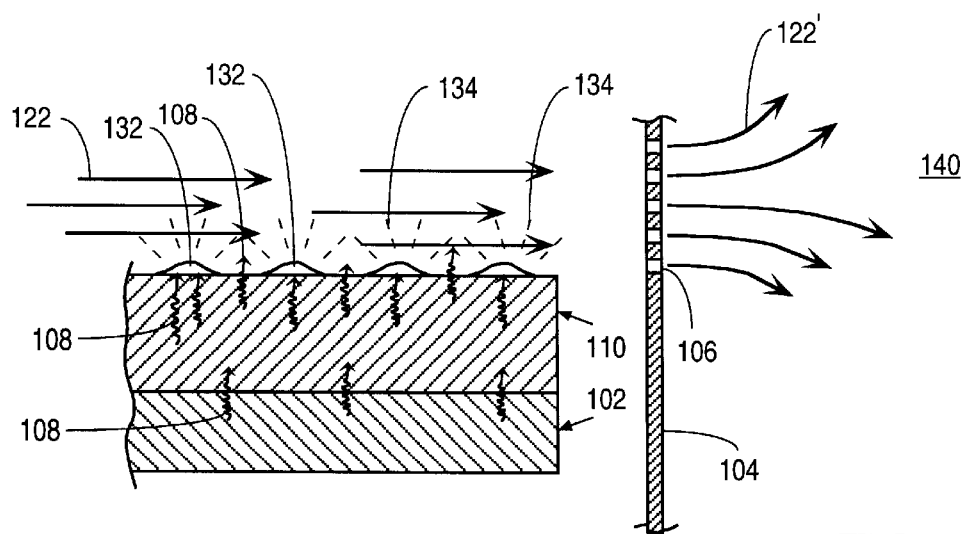
FIG. 2 is an enlarged, partial, cross-sectional view of a heat removal system in accordance with an embodiment of the invention.
Figure 3:
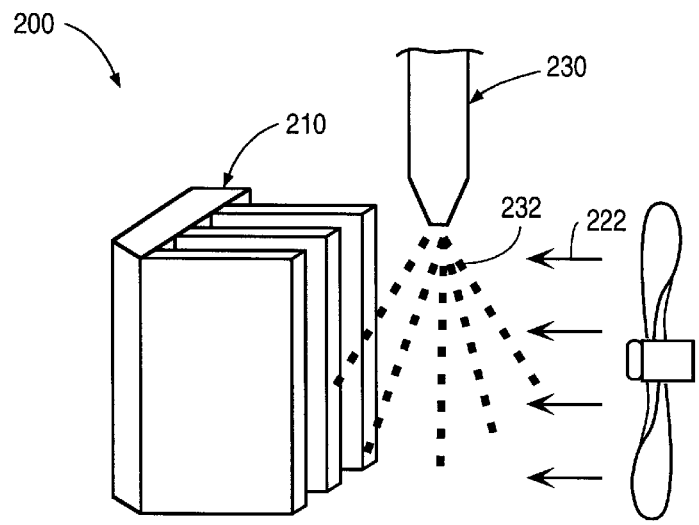
FIG. 3 is a schematic view of another configuration of a heat removal system in accordance with an embodiment of the invention.
Figure 4:
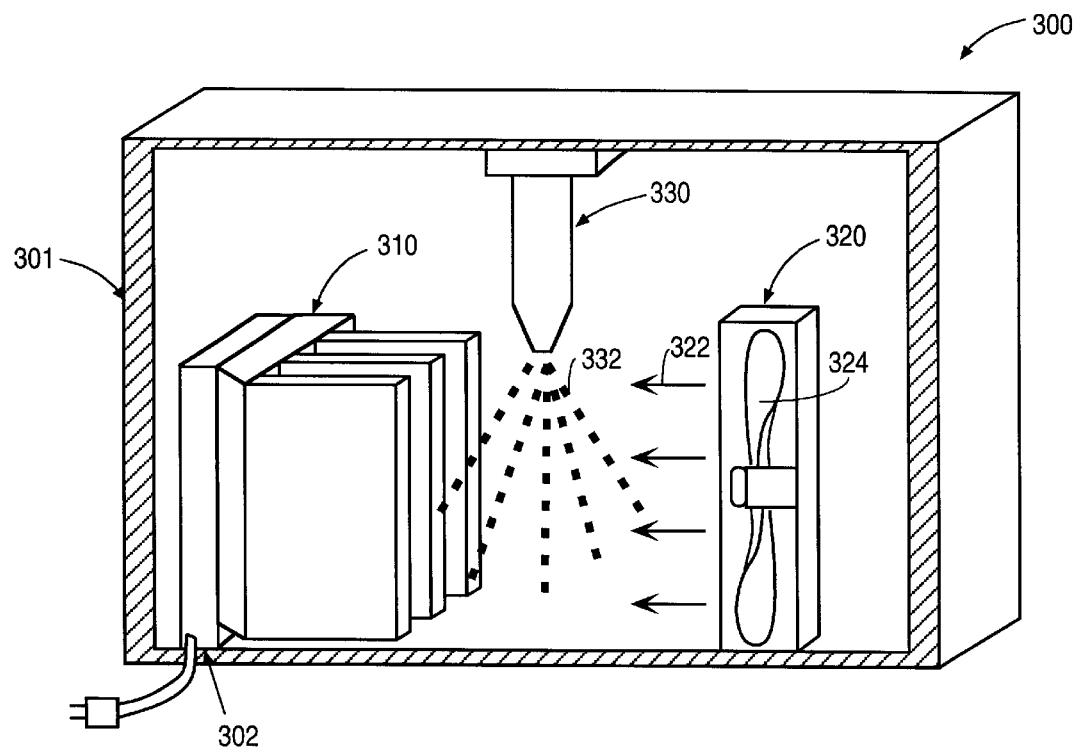
FIG. 4 is a schematic view of a heat removal system in accordance with another embodiment of the invention.
Figure 5:
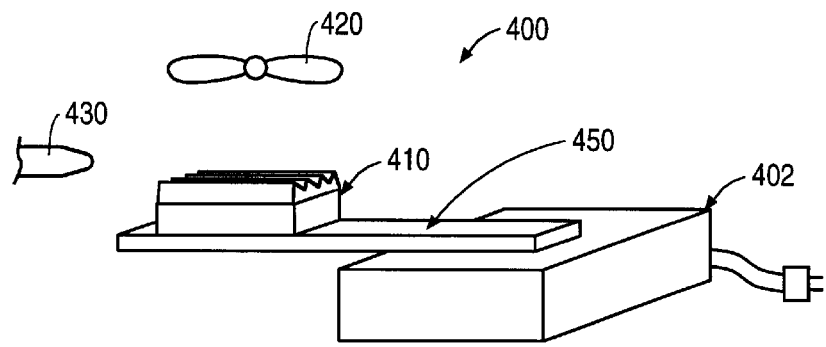
FIG. 5 is a perspective view of a heat removal system in accordance with another embodiment of the invention.
Figure 6:
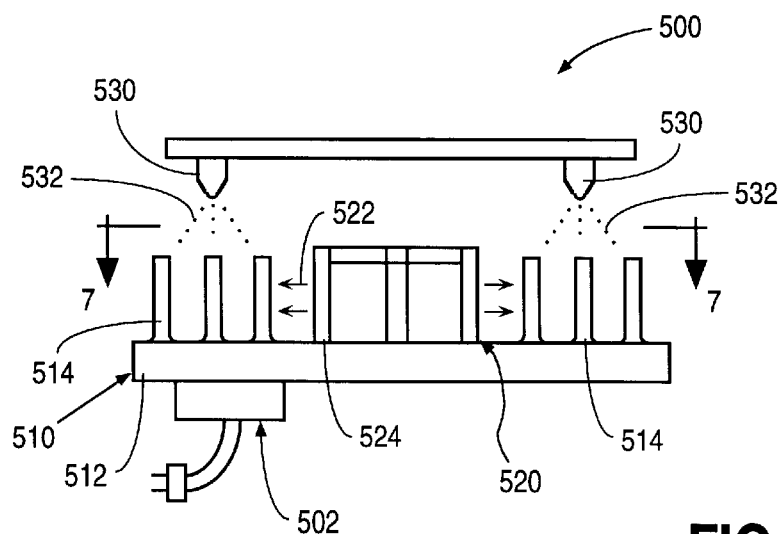
FIG. 6 is a side elevational view of a heat removal system in accordance with another embodiment of the invention.
Figure 7:
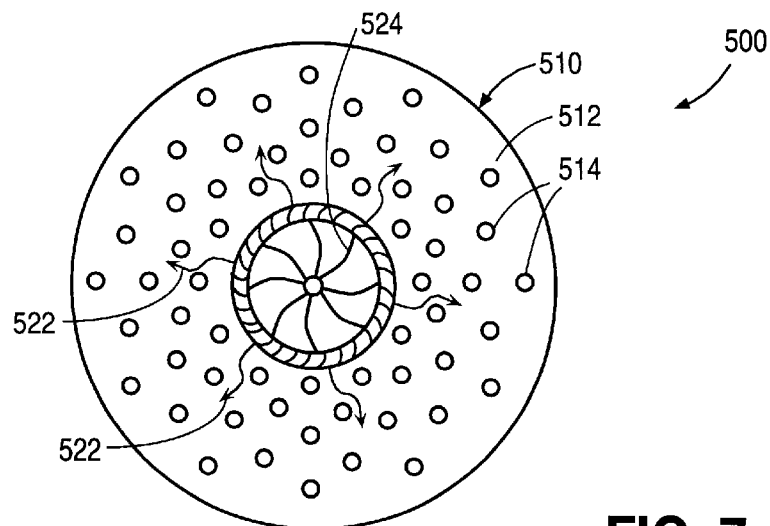
FIG. 7 is a top view of the heat removal system of FIG. 6 taken along line 7—7 of FIG. 6.
Figure 8:
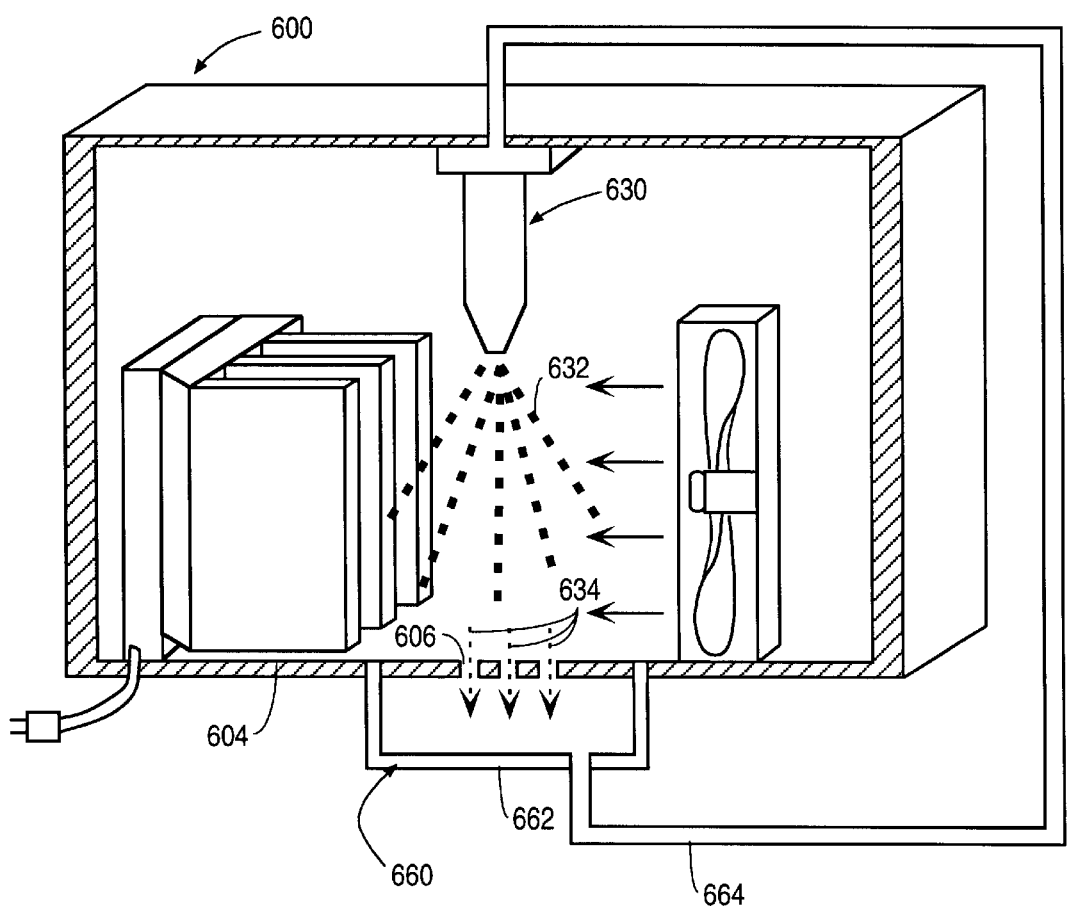
FIG. 8 is a schematic view of a heat removal system in accordance with another embodiment of the invention.

FIG. 2 shows a more detailed representation of the water droplets 132 as they rest on heat sink 110 and absorb heat energy that is transferring from electric device 102 through heat sink 110 and into droplets 132. Heat energy is represented in FIG. 2 by arrows 108. FIG. 2 also shows droplets 132 evaporating or transforming into vapor 134. Vapor 134 is shown dispersing onto gas stream 122 that has been directed across heat sink 110. FIG. 2 also shows a portion of a housing 104 that can be a cabinet of a computer system, for example. Holes 106 in housing 104 are provided as a vent for gas stream 122 after gas stream 122 has absorbed vapor 134 from the evaporating water droplets 132. Gas stream 122' is shown in FIG. 2 exiting through holes 106 and into the ambient atmosphere 140.

Referring again to FIG. 1, heat sink 110 is coupled to electric device 102 such that a heat absorbing surface on the heat sink 110 directly contacts a heat emanating surface on electric device 102. Heat sink 110 can be thermally coupled to electric device 102 in any of several ways known in the art. For example, a thermally conductive adhesive can be applied between heat sink 110 and electric device 102. Alternatively, close physical contact between surfaces of the heat sink 110 and the electric device 102 can provide thermal coupling.

It is not necessary, however, for heat sink 110 to be in direct physical contact with electric device 102. For example, heat sink 110 can be thermally coupled to electric device 102 through an intermediate heat transfer mechanism such as a heat pipe or a heat slug. In such a configuration, a separate structure can be disposed between heat sink 110 and electric device 102 that carries the heat energy from a heat emanating surface of electric device 102 to heat sink 110.

In the exemplary embodiment shown in FIG. 1, heat sink 110 includes a base 112 and fins 114 extending from base 112. Fins 114 provide an increased surface area on heat sink 110 so that more heat can be dissipated from heat sink 110. Fins 114 can have any of a variety of shapes and configurations. For example, rather than fins 114 that are generally rectangular and elongated as in the embodiment of FIG. 1, generally cylindrical pins can be provided that extend from base 112 of heat sink 110. Alternatively, heat sink 110 need not have fins 114 at all.

Heat sink 110 can be made of a variety of materials. A metal such as copper is typically used because of its high thermal conductivity. Other materials such as aluminum, steel, or metal filled plastic can be used. Various alloys of metals such as aluminum, zinc, or other thermally conductive metals can also be used for heat sink 110.

The efficiency of the heat removal system can be improved by increasing the liquid surface area on the heat sink surface. It is desirable to have the liquid distributed on the surface of the heat sink 110 such that the liquid does not form puddles or large droplets that would evaporate more slowly. An embodiment of heat sink 110 can include a coating or surface treatment that encourages the even distribution of the liquid droplets on the surface of the heat sink. The even distribution of the liquid is encouraged when the heat sink has a textured surface such as that of a sintered metal material. Alternatively, a coating or textured surface can be applied to the body of the heat sink. A textured surface on heat sink 110 is conducive to capillary action that distributes water evenly over the surface.

FIG. 1 also shows a gas source 120. A gas stream 122 is symbolized by arrows in FIG. 1. The example of a gas source 120 shown in FIG. 1 is a fan. Alternatively, gas source 120 can be any mechanism that provides a stream 122 of gas such as an air compressor. Still another alternative gas source provides no forced gas stream, but simply an entry way for a gas that is not forced to move past heat sink 110. In this case, the heat from the electric device is dissipated from heat sink 110 by natural convection with the added efficiency provided by the evaporated liquid.

Examples of types of fans that can be used as a gas source in the heat removal system are axial or centrifugal blowers. Another example of a fan suitable for use in other embodiments is a brushless motor muffin fan such as is commonly used in personal computers.

Air is a convenient gas that can be used in heat removal system 100. Ambient air is a fair conductor of heat and generally presents no environmental problems. Ambient air can be exhausted to the atmosphere outside of the computer system or machine in which electric device 102 operates. Other thermally conductive gases can be used in the heat removal system 100 in various embodiments of the invention. Due to the environmentally harmful nature of certain gases, however, it may be impractical to allow the gases to be exhausted into the atmosphere 140 as can be easily done when air is the gas. A gas other than air may safely be used in a closed system wherein ambient atmosphere 140 is enclosed within a sealed housing, for example.

FIG. 1 also shows liquid source 130 from which liquid droplets 132 are dispensed onto the heat sink 110. One example of a liquid source that can be used with various embodiments includes a series of very small orifices through which high pressure water is pumped, as used in water mist air conditioning systems. Liquid droplets 132, after coming to rest on heat sink 110, absorb heat from heat sink 110 and evaporate into the gas surrounding heat sink 110. Liquid source 130 preferably provides finely atomized liquid by high pressure or by mechanical means. It is to be appreciated that the finer the atomization of the liquid, the better the performance of the system.

Figure 9:
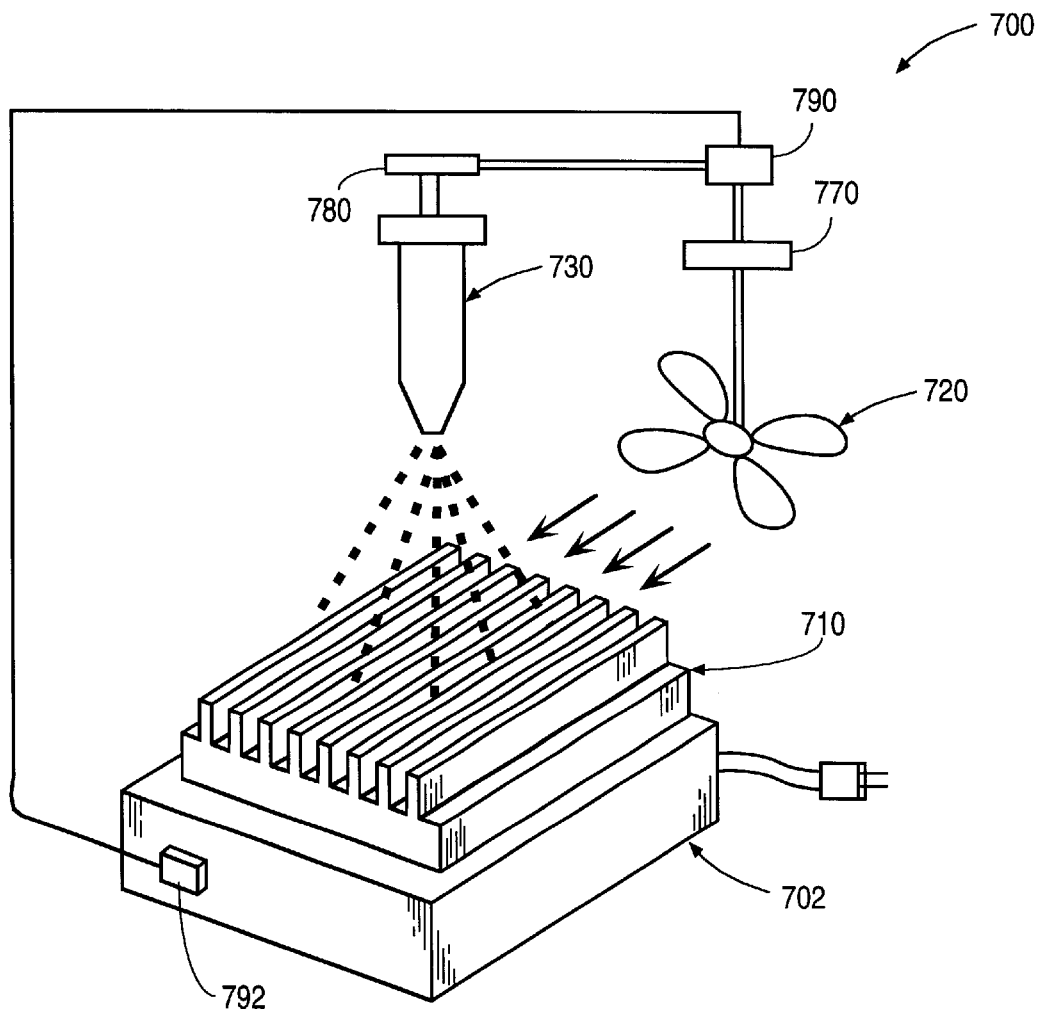
FIG. 9 is a schematic view of a heat removal system in accordance with another embodiment of the invention.

Water is a desirable liquid that can be used in the method and apparatus of the various embodiments of the invention because water has a very high latent heat of vaporization. Also, water is convenient, readily available and environmentally benign. Deionized and purified water can be used in the system 100 because deionized and purified water is less likely to introduce residue accumulating on heat sink 110 due to impurities in the water being left behind after the water evaporates. The residue that can be left behind when non-purified water is used in the system can interfere with the thermal transfer of heat energy out of heat sink 110.

The system 100 shown in FIG. 1 can remove heat generated by electric device 102 more efficiently than a simple heat sink 110 that relies on natural convection alone to dissipate heat into the atmosphere 140. The use of a gas source 120 and a liquid source 130, in combination with the heat sink 110, allows the heat removal system 100 to be physically compact yet highly efficient.

As the relative humidity of the ambient atmosphere decreases, more heat can be absorbed by the ambient atmosphere and carried away by the gas stream. As the relative humidity decreases and the heat absorbed increases, the exit temperature of the air increases. Since the water passes into the vapor state and exits with the normal air flow, no pipes, valves, or the like need be used to recirculate the water. Thus, a great deal of heat can be removed from a given system with a small amount of water.

FIG. 3 shows a heat removal system 200 of another embodiment wherein liquid source 230 injects droplets 232 into gas stream 222, rather than directly onto heat sink 210. In this example, the droplets 232 are carried by gas stream 222 onto heat sink 210.

FIG. 4 shows a heat removal system 300 in accordance with another embodiment in which an electric device 302 is part of an assembly 301 such as a computer system. It is contemplated that a retrofit of an existing system can be provided which includes the electric device 302, wherein the heat removal system 300 is created by introducing a heat sink 310, a gas source 320, and a liquid source 330 into the assembly 301 that only includes electric device 302. The existing assembly 301 may also include heat sink 310 and fan 324. In such a case only liquid source 330 would be added to the system to provide the heat removal system 300. Heat sink 310, gas source 320, and liquid source 330 can be removably mounted in assembly 301 as part of a retrofit or upgrade kit.

Examples of an assembly 301 can be computer systems such as server systems that currently use more complex liquid cooling systems or systems with relatively noisy fans which drive air at a high velocity over relatively large heat sinks. Another example of an assembly 301 in which heat removal system 300 can be used is a high performance work station. Generally, any computer system that uses high power devices such as microprocessors are likely candidates for a heat removal system as described herein. It should be noted that the configuration shown in FIG. 4 wherein the liquid source 330 injects droplets 332 into the gas stream 322 is merely exemplary. The assembly 301 can include any liquid source and gas source configuration described herein or an equivalent.

FIG. 5 shows a heat removal system 400 in accordance with another embodiment of the invention wherein system 400 includes electric device 402, heat sink 410, gas source 420, and liquid source 430. Additionally, a thermally conductive member 450 such as a heat pipe or a copper slug can be provided to carry heat generated by electric device 402 to heat sink 410. When a heat carrying device such as thermally conductive member 450 is provided, heat sink 410 can be located in a remote location from electric device 402. Heat sink 410, gas source 420 and liquid source 430 operate as described above with regard to previous embodiments.

Where thermally conductive member 450 is a heat pipe, it operates in a manner known in the art wherein the heat pipe includes interior channels and a wick structure. The area of the heat pipe thermally coupled to the heat generating device is known as the evaporation region of the heat pipe, and the opposite end of the heat pipe thermally coupled to the heat dissipation device is known as the condensation region. Heat energy is carried from the evaporation section to the condensation section of the heat pipe by vapor within the channels of the heat pipe. The vapor condenses back to liquid state in the condensation section of the heat pipe after the heat energy is transferred to the heat sink. The liquid is then transferred by capillary action through the channels and the wicking structure within the heat pipe to the evaporation section where the cycle repeats.

FIGS. 6 and 7 show a heat removal system 500 in accordance with another embodiment of the invention. FIG. 6 shows the heat removal system 500 including a heat sink 510, a gas source 520 and a liquid source 530. The heat removal system 500 uses a centrifugal blower 524 as the gas source 520. Heat sink 510 includes a base 512 from which extend fins 514. Fins 514 can be pins and can be arranged in any suitable pattern such that gas stream 522 created by centrifugal blower 524 can pass over fins 514. At least one liquid source 530 can provide liquid droplets 532 onto fins 514. FIG. 6 shows liquid sources 530 positioned above heat sink 510 and directing droplets 532 down onto fins 514.

FIG. 7 shows centrifugal blower 524 centrally located among pin fins 514. The axis of blower 524 is generally parallel to the axes of fins 514. Fins 514 can be arranged in a generally angular pattern on base 512 of heat sink 510 such that gas stream 522 (illustrated by radially extending arrows) is forced by blower 524 through the array of pin fins 514.

FIG. 7 shows the blades of blower 524 located centrally among fins 514. Alternatively, the fan can be configured such that the blades surround the outside of the group of fins. Yet another embodiment can have the blades located within an annular area among the fins such that there are fins on both sides of the blower 524 blades.

Referring again to FIG. 6, electric device 502 can be thermally coupled directly to base 512 of heat sink 510 or can be thermally coupled to a heat pipe similarly to a previously described embodiment.

FIG. 8 shows a system 600 in accordance with another embodiment of the invention. System 600 includes a dehumidifying and recirculation system 660 such that the liquid that has absorbed heat energy and has been carried away in the gas stream can be reused. The example of a dehumidifying and recirculation system 660 shown in FIG. 8 includes a dehumidifier unit 662 and a liquid channel 664 that carries condensed liquid from dehumidifier unit 662 back to liquid source 630. The liquid droplets 632, after being heated and transformed into vapor 634, exit the housing 604 of the system 600 through holes 606. Holes 606 are preferably in communication with dehumidifier 662. Once the vapor 634 enters the dehumidifier 662, it is condensed back into a liquid state and then carried by channel 664 to liquid source 630 to be reused in the system 600. System 600 may include a pump for pumping the liquid from the dehumidifier 662 to liquid source 630.

FIG. 9 illustrates a heat removal system 700 in accordance with another embodiment that includes controllers that control the rate of flow of the stream of gas or air directed onto the heat sink. The controllers can also control the rate of dispensing the liquid onto the heat sink. System 700 includes gas source 720 and liquid source 730. Gas source 720 is coupled to gas controller 770. Likewise, liquid source 730 is coupled to liquid controller 780. Gas controller 770 and liquid controller 780 can also be coupled to or incorporated into system controller 790. A temperature sensor 792 can be attached to electric device 702 to monitor the operating temperature of electric device 702. Alternatively, temperature sensor 792 can be attached to the heat sink 710. Another alternative placement for the temperature sensor 792 is at a location (not shown) that would allow monitoring of the air flow temperature. The system 700 of FIG. 9 can improve the overall efficiency of the entire system by controlling the amount of water used and also energy used to operate the gas source 720.

System 700 operates by controlling the rate of liquid dispensed or the amount of gas flow over the heat sink in response to preselected temperature levels for either the electric device, heat sink, or air temperature. For example, temperature sensor 792 monitors the temperature of the electric device 702 or the heat sink 710, and sends a signal back to system controller 790 which then sends control signals to either gas controller 770 or liquid controller 780. The amount of flow of the gas or the dispensing of droplets of liquid can be decreased, for example, when the heat sink reaches a preselected low temperature or can be increased when the heat sink reaches a preselected high temperature. Alternatively, the flow of gas or the dispensing of liquid can be turned on and off in response to the sensing of high or low preselected temperatures.

Also, system 700 can control the rate of dispensing liquid or the flow of the gas stream in response to a change in the temperature detected by temperature sensor 792. In this case, the gas source 720 and liquid source 730 can be controlled with respect to amount of flow or rate of dispensing in response to increases or decreases of the temperature. The amount of flow or the rate of dispensing can be controlled to be relative to the temperature sensed.

Figure 10:
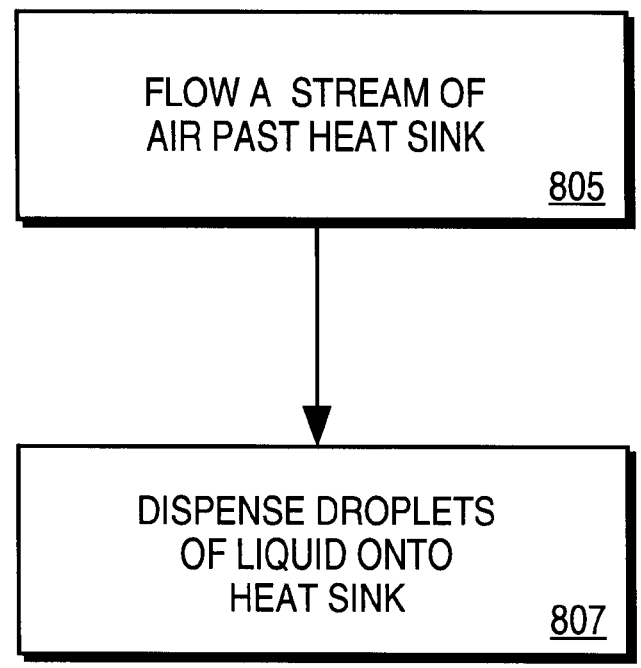
FIG. 10 is a flowchart of a method of removing heat from a heat source in accordance with an embodiment of the invention.

FIG. 10 illustrates a method 800 of one embodiment to remove heat from an electric device. The method 800 includes flowing 805 or directing a stream of air past a heat sink that is coupled to an electric device. The method 800 further includes dispensing 807 droplets of liquid onto the heat sink. As previously described with reference to the apparatus of the various embodiments, the dispensing 807 of the droplets of the liquid onto the heat sink can be performed by either dispensing the droplets directly onto the heat sink or dispensing the droplets into the stream of air such that the droplets are carried by the stream of air onto the heat sink. Once on the heat sink, the droplets absorb heat from the heat sink and evaporate into the stream of air to be exhausted into the ambient atmosphere.

For some embodiments, the method can include dispensing droplets of a liquid into a stream of air such that the droplets evaporate into the stream of air before contacting the heat sink. In other embodiments, the method can include cooling the stream of air before the stream impinges on the heat sink such that the relative humidity of the stream of air is decreased in order to enhance the evaporative cooling effect.

A method and an apparatus for improving the thermal efficiency of a heat sink have been described. Although the present invention has been described with reference to specific exemplary embodiments, the specification and drawings are to be regarded in an illustrative rather than a restrictive sense.

What is claimed is:

1. A heat removal system comprising:
   a heat sink having a base and fins extending from said base, the base being thermally coupled to a heat source;
   a gas source to direct a gas onto said heat sink; and
   a liquid source to dispense liquid droplets onto said heat sink, wherein said liquid droplets absorb heat from said heat sink and evaporate into said gas, and wherein said gas is exhausted into an ambient atmosphere after said liquid droplets evaporate into said gas.

2. The system of claim 1 wherein said gas includes ambient air.

3. The system of claim 1 wherein said liquid includes water.

4. The system of claim 1 wherein said gas source is a fan.

5. The system of claim 1 wherein said gas source is a blower.

6. The system of claim 1 wherein said liquid source is an atomizer.

7. The system of claim 1 wherein said heat source is an electric device.

8. The system of claim 7 wherein said electric device is a microprocessor.

9. The system of claim 1 wherein said heat sink includes a surface treatment that distributes said liquid droplets on a surface of said heat sink.

10. A heat removal system comprising:
    a liquid source to dispense droplets of a liquid onto a heat sink thermally coupled to an electric device, the heat sink having a base and fins extending from said base, wherein said droplets absorb heat from said heat sink and evaporate; and
    a gas source to flow a stream of a gas to impinge on said heat sink and to carry said evaporated droplets away from said heat sink, wherein said gas carrying said evaporated droplets is exhausted into an ambient atmosphere.

11. The system of claim 10 wherein said gas includes ambient air.

12. The system of claim 10 wherein said liquid includes water.

13. The system of claim 10 wherein said gas source is a fan.

14. The system of claim 10 wherein said gas source is a blower.

15. The system of claim 10 wherein said liquid source is an atomizer.

16. The system of claim 10 wherein said electric device is a microprocessor.

17. The system of claim 10 wherein said heat sink includes a surface treatment that distributes said liquid droplets on a surface of said heat sink.

* * * * *